(12) United States Patent
Zollner et al.

(10) Patent No.: US 11,735,419 B2
(45) Date of Patent: Aug. 22, 2023

(54) METHOD FOR PROCESSING OF SEMICONDUCTOR FILMS WITH REDUCED EVAPORATION AND DEGRADATION

(71) Applicant: The Regents of the University of California, Oakland, CA (US)

(72) Inventors: Christian J. Zollner, Goleta, CA (US); Michael Iza, Goleta, CA (US); James S. Speck, Santa Barbara, CA (US); Shuji Nakamura, Santa Barbara, CA (US); Steven P. DenBaars, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 67 days.

(21) Appl. No.: 16/752,428

(22) Filed: Jan. 24, 2020

(65) Prior Publication Data

US 2020/0243334 A1    Jul. 30, 2020

Related U.S. Application Data

(60) Provisional application No. 62/796,340, filed on Jan. 24, 2019.

(51) Int. Cl.
*H01L 21/02* (2006.01)
*H01L 29/20* (2006.01)
*H01L 29/201* (2006.01)

(52) U.S. Cl.
CPC .... *H01L 21/02664* (2013.01); *H01L 21/0254* (2013.01); *H01L 21/02617* (2013.01); *H01L 29/201* (2013.01); *H01L 29/2003* (2013.01)

(58) Field of Classification Search
None
See application file for complete search history.

(56) References Cited

U.S. PATENT DOCUMENTS 5,656,832 A     8/1997  Ohba et al.
2003/0203531 A1*  10/2003  Shchukin .......... H01L 21/02395
                                            438/77

(Continued)

FOREIGN PATENT DOCUMENTS

JP      8186332         7/1996
JP     11224859         8/1999
JP   2004343132 A      12/2004

OTHER PUBLICATIONS

PCT International Search Report & Written Opinion dated Apr. 23, 2020 for PCT Application No. PCT/US20/15073.

(Continued)

*Primary Examiner* — Khaja Ahmad
(74) *Attorney, Agent, or Firm* — Gates & Cooper LLP

(57) ABSTRACT

A method for protecting a semiconductor film comprised of one or more layers during processing. The method includes placing a surface of the semiconductor film in direct contact with a surface of a protective covering, such as a separate substrate piece, that forms an airtight or hermetic seal with the surface of the semiconductor film, so as to reduce material degradation and evaporation in the semiconductor film. The method includes processing the semiconductor film under some conditions, such as a thermal annealing and/or controlled ambient, which might cause the semiconductor film's evaporation or degradation without the protective covering.

13 Claims, 3 Drawing Sheets

(56) References Cited

U.S. PATENT DOCUMENTS

| | | | |
|---|---|---|---|
| 2008/0111144 A1* | 5/2008 | Fichtenbaum | B82Y 20/00 257/E21.04 |
| 2008/0146008 A1* | 6/2008 | Han | H01L 21/02381 438/509 |
| 2010/0147835 A1* | 6/2010 | Mulpuri | H01L 21/02491 219/121.85 |
| 2011/0108944 A1* | 5/2011 | Fujikura | H01L 21/02458 438/479 |
| 2011/0217505 A1* | 9/2011 | Callahan | B32B 3/02 428/80 |
| 2013/0056793 A1 | 3/2013 | Srinivasan | |
| 2014/0227864 A1 | 8/2014 | Okuno et al. | |
| 2015/0115220 A1 | 4/2015 | Iza et al. | |
| 2015/0380238 A1 | 12/2015 | Takashima et al. | |
| 2015/0380498 A1 | 12/2015 | Tanaka et al. | |
| 2016/0233108 A1* | 8/2016 | Feigelson | H01L 23/34 |
| 2017/0179272 A1 | 6/2017 | You et al. | |
| 2017/0222090 A1 | 8/2017 | Bedell et al. | |
| 2018/0061700 A1 | 3/2018 | Sun et al. | |

OTHER PUBLICATIONS

Flack, W.W., et al., "Process Characterization of One Hundred Micron Thick Photoresist Films", SPIE Microlithography, 1999, pp. 1-17.

Saifaddin, B., et al., "Developments in AlGaN and UV-C LEDs grown on SiC", Proc. of SPIE, 2018, pp. 105541E-1-105541E-10, vol. 10554.

Extended European Search Report dated Feb. 22, 2022 for EP Application No. 20744318.5.

Korean Notice of Non-Final Rejection (with English translation) dated Sep. 3, 2022 for Korean Patent Application No. 10-2021-7023613.

Japanese Notice of Reasons for Rejection dated Aug. 22, 2022 for JP Application No. 2021-541269.

* cited by examiner

METHOD FOR PROCESSING OF SEMICONDUCTOR FILMS WITH REDUCED EVAPORATION AND DEGRADATION

CROSS REFERENCE TO RELATED APPLICATIONS

This application claims the benefit under 35 U.S.C. Section 119(e) of the following commonly-assigned application:

U.S. Provisional Application Ser. No. 62/796,340, filed on Jan. 24, 2019, by Christian J. Zollner, Michael Iza, James S. Speck, Shuji Nakamura and Steven P. Denbaars, entitled "METHOD FOR THERMAL TREATMENT OF SEMICONDUCTOR LAYERS WITH REDUCED EVAPORATION,";

which application is incorporated by reference herein.

BACKGROUND OF THE INVENTION

1. Field of the Invention

This invention relates to a method for use in the processing of a semiconductor film sample by covering the sample with a separate protective covering in order to prevent evaporation or degradation of the semiconductor film.

2. Description of the Related Art

The usefulness of gallium nitride (GaN), and its ternary and quaternary compounds incorporating aluminum and indium (AlGaN, InGaN, AlInGaN), has been well established for the fabrication of visible and ultraviolet optoelectronic devices and high-power electronic devices. These devices are typically grown epitaxially using growth techniques comprising molecular beam epitaxy (MBE), metalorganic chemical vapor deposition (MOCVD), and hydride vapor phase epitaxy (HVPE).

Additionally, the development of AlGaN for short wavelength devices enabled nitride based light emitting diodes (LEDs) and laser diodes (LDs) to overtake many other research ventures. Consequently, AlGaN based materials and devices have become the dominant material system used for ultraviolet light semiconductor applications.

However, the growth of high quality AlN and AlGaN with high aluminum content remains a challenge. These materials, along with all other III-nitride semiconductor materials, can be improved with various processing techniques, but there is often risk of film evaporation or degradation in these processing steps. By protecting the film using a separate protective covering, the film's evaporation or degradation can be reduced.

SUMMARY OF THE INVENTION

The present invention discloses a method for processing of semiconductor films with reduced evaporation or degradation. The method includes: providing a protective covering on or above a surface of a semiconductor film, in order to prevent evaporation or degradation of the semiconductor film during processing; and processing the semiconductor film and the protective covering under one or more conditions that would cause evaporation or degradation of the semiconductor film without the protective covering, wherein the semiconductor film is processed to improve or change a material or device characteristic of the semiconductor film; and wherein the protective covering is a chemically inert material in the conditions under which the semiconductor film is processed.

The semiconductor film is grown on a substrate, and is comprised of one or more nitride based layers, wherein the nitride based layers are comprised of (Al,Ga,In,B)N semiconductors, and the nitride based layers are grown on a polar plane, a nonpolar plane, or a semipolar plane.

The protective covering has an epi-ready surface that forms an airtight or hermetic seal with the surface of the semiconductor film, wherein the protective covering forms a direct contact with the semiconductor film. Preferably, the protective covering has a thickness of at least 10 microns. The protective covering is removed after the processing of the semiconductor film, without any rinsing, cleaning, or chemical or physical etching procedures.

The conditions in which the semiconductor film and protective covering are processed may comprise a high-temperature thermal annealing that heats the semiconductor film and the protective covering to a high temperature of at least about 1000° C., for example, about 1000° C. to 2500° C. The conditions in which the semiconductor film and protective covering are processed may also comprise a controlled ambient that exposes the semiconductor film and the protective covering to semiconductor processing gases, wherein the semiconductor processing gases comprise nitrogen, argon, ammonia, hydrogen, oxygen, or a forming gas. The semiconductor film and the protective covering may be exposed to the semiconductor processing gases at a pressure less than about 100 atmospheres, for example, less than about 1 atmospheres.

Finally, the protective covering is comprised of silicon carbide (SiC), sapphire ($Al_2O_3$), aluminum nitride (AlN), gallium nitride (GaN), or spinel ($MgAl_2O_4$).

BRIEF DESCRIPTION OF THE DRAWINGS

Referring now to the drawings in which like reference numbers represent corresponding parts throughout.

DETAILED DESCRIPTION OF THE INVENTION

Figure 1:
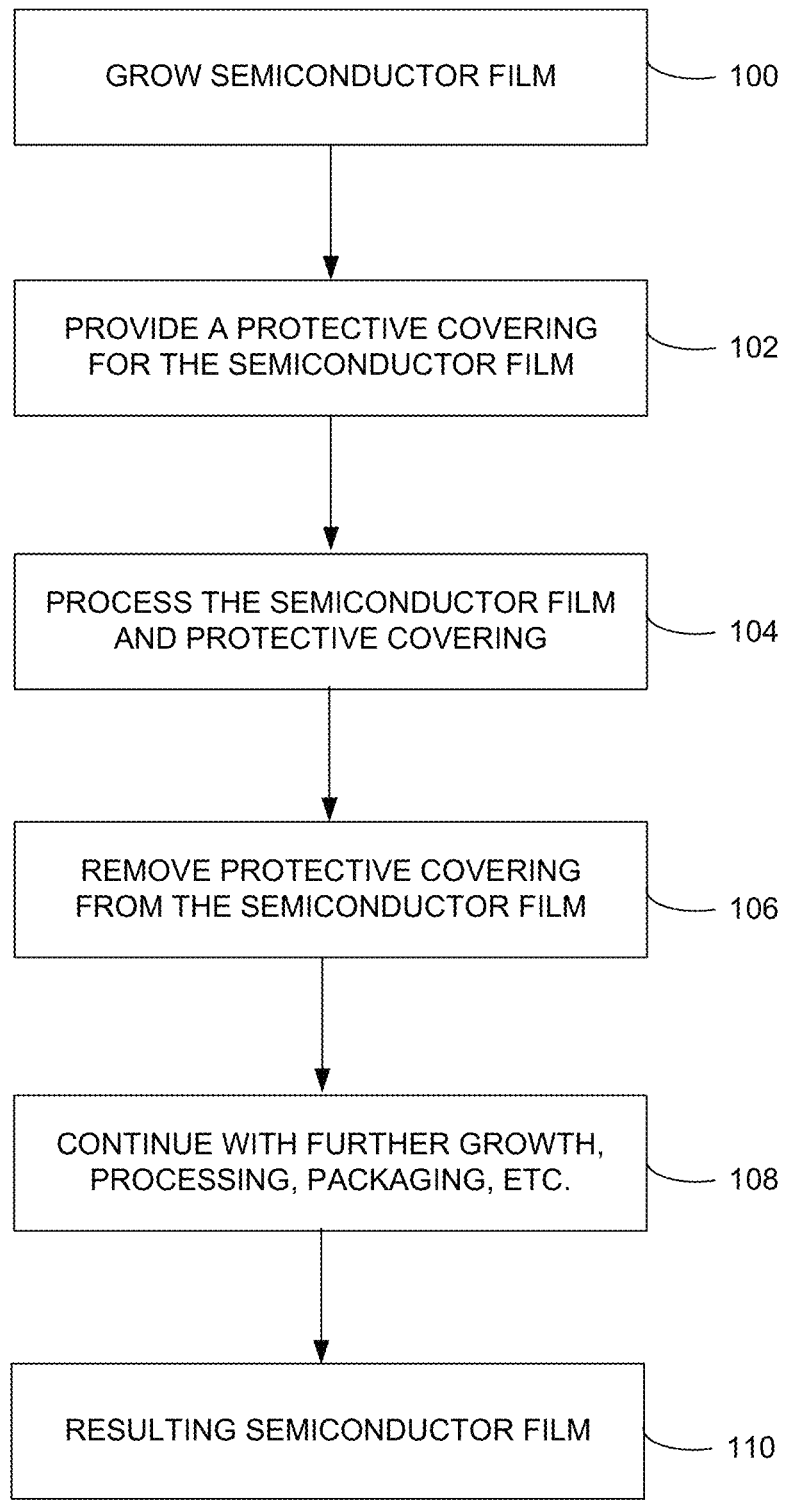
FIG. 1 is a flowchart of process steps used in one embodiment of the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a method for protecting a sample comprising a semiconductor film by placing the film in direct contact (i.e. covering) with a protective covering, such as a separate substrate piece, during sample processing steps. The sample processing steps refer to treating the semiconductor film in some condition, such as high-temperature thermal annealing and/or a controlled ambient of exposure to some semiconductor processing gases and/or in low pressure atmospheres, etc., which might cause evaporation or degradation of the film without the protective covering, with the goal of improving or changing material or device characteristics of the film.

Protecting the semiconductor film by covering the film with the protective covering offers a means of preventing the evaporation or degradation of the film during the sample processing steps through an airtight or hermitic seal which is formed between the two atomically flat surfaces of the film and the protective covering. This protection affords greater flexibility for exposing the sample to conditions or treatments which might normally cause the evaporation or degradation of the film.

The sample processing steps may comprise of heating the semiconductor film and the protective covering to a high temperature greater than about 1000° C., and more preferably, about 1000° C. to 2500° C. Temperatures above 2500° C. may be used, but typically require specialized equipment and processes, and therefore are not practical for most applications.

The sample processing steps may also comprise exposing the semiconductor film and the protective covering to one or more semiconductor processing gases, such as nitrogen, argon, ammonia, hydrogen, oxygen, a forming gas, or some other process gas, and/or a low pressure atmosphere of less than about 100 atmospheres, and more preferably, about 1 atmosphere or less. In addition, the sample processing steps may comprise other harsh conditions such as aggressive chemistries including hydrogen.

In one embodiment, the semiconductor film is comprised of one or more nitride based layers grown on a substrate. The terms "nitride based layers" or "III-nitrides" or "nitrides" refer to any alloy composition of the (Al,Ga,In,B)N semiconductors having the formula

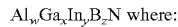

$Al_w Ga_x In_y B_z N$ where:

$0 \leq w \leq 1$, $0 \leq x \leq 1$, $0 \leq y \leq 1$, $0 \leq z \leq 1$, and $w+x+y+z=1$.

The nitride based layers may comprise multiple layers having varying or graded compositions, one or more layers of similar (Al,Ga,In,B)N composition, or one or more layers of dissimilar (Al,Ga,In,B)N composition. The layers may also be doped with elements such as silicon, germanium, magnesium, boron, iron, oxygen, and zinc.

The nitride based layers may be grown using deposition methods comprising conventional chemical vapor deposition (CVD), plasma-enhanced chemical vapor deposition (PECVD), sputtering, atomic layer deposition (ALD), evaporation under vacuum or controlled ambients, ion beam deposition (IBD), hydride vapor phase epitaxy (HVPE), metalorganic chemical vapor deposition (MOCVD) or molecular beam epitaxy (MBE).

The nitride based layers may be grown in any crystallographic direction, such as on a polar c-plane, or on a nonpolar plane, such as an a-plane or m-plane, or on a semipolar plane, such as a {20-21}, {11-22} and {10-11} plane.

The nitride based layers may form a radiation emitting layer sequence. The radiation emitting layer sequence may comprise LEDs and LDs.

The nitride based layers may have improved or changed material or device characteristics when processed using the method of the present invention.

The protective covering, such as the separate substrate piece, may be comprised of silicon carbide (SiC), sapphire ($Al_2O_3$), aluminum nitride (AlN), gallium nitride (GaN), spinel ($MgAl_2O_4$), or any other commonly used substrate material. Preferably, the protective covering is inert under the conditions of the sample processing steps, in contrast to techniques that only reduce decomposition in short-duration, relatively "gentle" conditions (no harsh chemistries or low pressures), for example, that do not stop decomposition completely, but just slow it down.

The mechanism of semiconductor film protection should hold true regardless of the film's or protective covering's material type, growth method, or processing or storage condition particulars. However, the degree of protection and reduction in material loss or degradation will vary for different materials, growth methods, and processing or storage conditions.

Process Steps

FIG. 1 is a flowchart of process steps used in one embodiment of the present invention.

Block 100 represents the step of growing at least one semiconductor film on a substrate, for example, using conventional methods. In one embodiment, the semiconductor film is comprised of one or more nitride based layers.

Block 102 represents the step of providing a protective covering on or above a surface of a semiconductor film, in order to prevent evaporation or degradation of the semiconductor film during processing. In one embodiment, the protective covering is a chemically inert material in the conditions under which the semiconductor film is processed; the protective covering has an epi-ready surface that forms an airtight or hermetic seal with the surface of the semiconductor film; the protective covering forms a direct contact with the semiconductor film; and the protective covering has a thickness of at least 10 microns.

Block 104 represents the step of processing the substrate, the semiconductor film and the protective covering under one or more conditions that would cause evaporation or degradation of the semiconductor film without the protective covering. The conditions may comprise a high-temperature thermal annealing and/or a controlled ambient. The high-temperature thermal annealing heats the substrate, the semiconductor film and the protective covering to a high temperature of at least about 1000° C., for example, about 1000° C. to 2500° C. The controlled ambient exposes the substrate, the semiconductor film and the protective covering to semiconductor processing gases, wherein the semiconductor processing gases comprise nitrogen, argon, ammonia, hydrogen, oxygen, or a forming gas. The substrate, the semiconductor film and the protective covering may be exposed to the semiconductor processing gases at a pressure less than about 100 atmospheres, for example, about 1 atmosphere or less.

Block 106 represents the step of removing the protective covering from the semiconductor film, after processing, without any rinsing, cleaning, or chemical or physical etching procedures.

Block 108 represents the step of continuing with further growth, processing, packaging, etc., of the semiconductor film.

Block 110 represents the end result of the method, namely, the semiconductor film as processed, which may be part of a semiconductor film stack comprised of a plurality of films or layers. In one embodiment, the semiconductor film after processing has improved or changed material or device characteristics as compared to a semiconductor film that has not been so processed.

Finally, it is noted that steps 100-108 need not be performed in the exact order shown. For example, steps may be performed in another order, and/or individual steps may be omitted, without departing from the scope of the present invention.

Experimental Results

Figure 2:
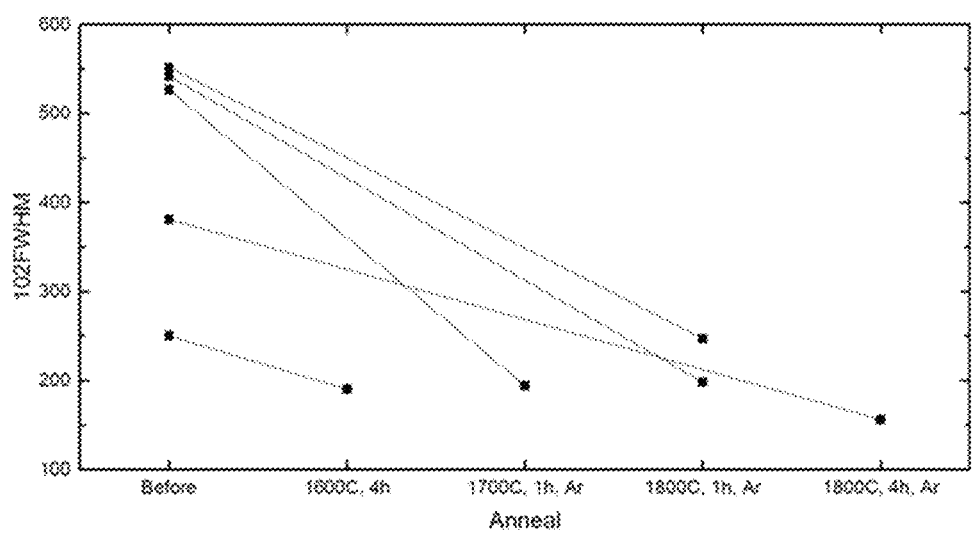
FIG. 2 shows a plot of x-ray diffraction data for semiconductor layers comprising Aluminum Nitride (AlN) layers deposited epitaxially onto a substrate comprising 6H-polytype Silicon Carbide (6H—SiC) with a protective covering of a separate SiC substrate piece to prevent material evaporation.

FIG. 2 shows a plot of x-ray diffraction data, comprised of a (102) X-ray rocking curve (omega) full-width at half-max (FWHM), vs. annealing conditions, for a semiconductor film comprising Aluminum Nitride (AlN) layers deposited epitaxially onto a substrate comprising 6H-polytype Silicon Carbide (6H—SiC). A protective covering comprising a separate SiC substrate piece was placed over the semiconductor layers, and then the entire sample, comprising the AlN layers, the 6H—SiC substrate, and the separate SiC substrate piece, was subjected to anneals at various temperatures of 1600° C. for 4 hours, 1700° C. for 1 hour in an Argon (Ar) ambient, 1800° C. for 1 hour in an Ar ambient, and 1800° C. for 4 hours in an Ar ambient.

The x-ray diffraction data is known to be a figure of merit for crystal quality, tracking threading dislocation density. For example, a value of FWHM=500 corresponds to 5E9 $cm^{-2}$, whereas a value of FWHM=190 corresponds to 4E8 $cm^{-2}$, as confirmed by unpublished TEM (transmission electron microscopy) data.

As shown in the plot, crystal quality is significantly improved for the AlN layers grown on the 6H—SiC and protectively covered by the separate SiC substrate piece to prevent material evaporation, when employing a high-temperature anneal treatment. Specifically, the covered samples show material improvement, while uncovered samples evaporate completely, irrespective of treatment condition.

Figures 3A, 3B:
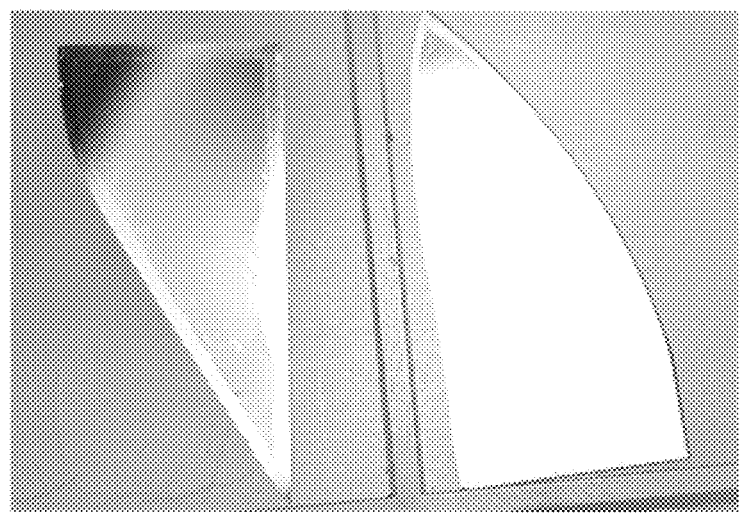
FIGS. 3(a) and 3(b) are optical images of two samples subjected to high temperatures, showing the difference between protected (not evaporated) samples and unprotected (fully evaporated) samples.

FIGS. 3(a) and 3(b) are optical images of two pieces of the same AlN/SiC wafer treated at 1650° C. for 4 hours under 0.6 atm of argon (Ar) ambient, showing the difference between protected (not evaporated) AlN/SiC samples in FIG. 3(a), and unprotected (fully evaporated) AlN/SiC samples in FIG. 3(b), from identical epi wafers with identical annealing treatments.

Specifically, for contrast, FIG. 3(a) shows a surface of an AlN epilayer subjected to an annealing condition with a protective SiC covering, and FIG. 3(b) shows a surface of an AlN epilayer subjected to the same annealing condition without a protective SiC covering. The protected AlN epilayer in FIG. 3(a) exhibits reduced material degradation and evaporation resulting from protection by a separate substrate piece, while the unprotected AlN epilayer in FIG. 3(b) has fully evaporated. Specifically, the sample of FIG. 3(a) was protected with a protective SiC covering and almost all of the film remains (thickness measured using optical reflectance is nearly unchanged), while the sample of FIG. 3(b) was annealed under identical conditions without a protective SiC covering and the film has clearly evaporated (no AlN x-ray peaks were found for this sample).

ADVANTAGES AND IMPROVEMENTS

The present invention provides a protective covering for a semiconductor film to ensure prevention of material evaporation or degradation during processing, such as by high-temperature thermal annealing and/or a controlled ambient of exposure to semiconductor processing gases and/or low pressure atmospheres. The present invention provides a direct contact, airtight or hermetic seal between the semiconductor film and the protective covering. The key advantage of this protection is that the semiconductor layers can be treated using, for example, high temperature thermal annealing and/or a controlled ambient, which improves material or device characteristics of the film, while preventing evaporation or degradation of the film.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method, comprising:
    (a) growing a semiconductor film comprised of aluminum-containing nitride based layers on or above a silicon carbide (SiC) substrate;
    (b) placing a protective covering comprised of a separate SiC substrate piece on a surface of the semiconductor film, wherein the protective covering forms an airtight or hermetic seal with the surface of the semiconductor film, in order to prevent evaporation or degradation of the semiconductor film during processing; and
    (c) processing the SiC substrate, the semiconductor film and the protective covering under one or more conditions that would cause evaporation or degradation of the semiconductor film without the protective covering;
    (d) wherein the protective covering is a chemically inert material in the conditions under which the semiconductor film is processed.

2. The method of claim 1, wherein the nitride based layers are grown on a polar plane, a nonpolar plane, or a semipolar plane.

3. The method of claim 1, wherein the protective covering has an epi-ready surface that forms the airtight or hermetic seal with the surface of the semiconductor film.

4. The method of claim 1, wherein the protective covering forms a direct contact with the semiconductor film.

5. The method of claim 1, wherein the protective covering has a thickness of at least 10 microns.

6. The claim of method 1, wherein the protective covering is removed after the processing, without any rinsing, cleaning, or chemical or physical etching procedures.

7. The method of claim 1, wherein the conditions comprise a high-temperature thermal annealing that heats the semiconductor film and the protective covering to a high temperature of at least about 1000° C.

8. The method of claim 7, wherein the high temperature is about 1000° C. to 2500° C.

9. The method of claim 1, wherein the conditions comprise a controlled ambient that exposes the semiconductor film and the protective covering to semiconductor processing gases.

10. The method of claim 9, wherein the semiconductor processing gases comprise nitrogen, argon, ammonia, hydrogen, oxygen, or a forming gas.

11. The method of claim 9, wherein the semiconductor film and the protective covering are exposed to the semiconductor processing gases at a pressure less than about 100 atmospheres.

12. The method of claim 11, wherein the pressure is less than about 1 atmospheres.

13. A semiconductor film treated by the method of claim 1.

* * * * *